United States Patent [19]

Celler et al.

[11] Patent Number: 4,494,303
[45] Date of Patent: Jan. 22, 1985

[54] METHOD OF MAKING DIELECTRICALLY ISOLATED SILICON DEVICES

[75] Inventors: George K. Celler, New Providence, N.J.; David J. Lischner, Salisbury, Pa.; McDonald Robinson, Chester, N.J.

[73] Assignee: AT&T Bell Laboratories, Murray Hill, N.J.

[21] Appl. No.: 480,825

[22] Filed: Mar. 31, 1983

[51] Int. Cl.³ ............................................. H01L 21/76
[52] U.S. Cl. ..................................... 29/576 W; 357/49
[58] Field of Search ........................ 29/576 W; 357/49

[56] References Cited

U.S. PATENT DOCUMENTS 4,381,201  4/1983  Sakurai .................................. 148/1.5
4,404,735  9/1983  Sakurai ............................ 29/576 W Primary Examiner—Aaron Weisstuch
Attorney, Agent, or Firm—Bruce S. Schneider

[57] ABSTRACT

Structures useful for dielectrically isolated high voltage devices are produced utilizing a melting technique. In this technique a cavity is produced in a silicon wafer, the surface of the cavity is, for example, oxidized to form a dielectric material, and silicon is deposited onto the dielectric material so that it extends to a region where it is in contact with single crystal silicon, e.g., a portion of the wafer. The entire region of polycrystalline silicon is then melted. Upon termination of the melting energy, the polycrystalline silicon is converted into a thick region of dielectrically isolated single crystal silicon. This thick region is useful for the formation of high voltage devices.

9 Claims, 3 Drawing Figures

METHOD OF MAKING DIELECTRICALLY ISOLATED SILICON DEVICES

BACKGROUND OF THE INVENTION

1. Field of the Invention

This invention relates to semiconductor devices and, in particular, to dielectrically isolated semiconductor devices.

2. Art Background

In most electronic components, such as integrated circuits, electrical isolation is produced between regions of essentially single crystal silicon by junction isolation. (Single crystal silicon is silicon having defects, e.g., linear and planar defects such as dislocations or stacking faults, respectively, in a density through the crystal of less than $10^8$ defects per $cm^2$.) In this junction approach, lateral isolation is accomplished by interposing between the active single crystal silicon regions, a region of opposite electrical type from that of the active region. The thickness of this added region is approximately equal to the depth of the active regions of the single crystal materials being separated. Similarly, vertical isolation in the junction isolation approach is obtained by the presence of material of opposite conductivity type positioned below the active region. (The active region is that portion of the single crystal silicon which is ultimately modified to contain electronic device structures. The active region is typically 1 μm thick for nominal voltage devices, e.g., devices operating at less than 30 V.) Such rectifying junctions formed at the boundaries of the active regions provide lateral and vertical isolation when appropriately biased.

For some applications lateral junction isolation is replaced with lateral dielectric isolation to save space and to reduce capacitance. (Lateral dielectric isolation entails the presence of an insulator rather than a material of opposite conductivity type at the lateral boundaries of the active region.) By expedients such as junction isolation or lateral dielectric isolation, transistors or other devices formed in one single crystal region, i.e., one active region, are electrically isolated and are prevented from interacting with devices in a second active region.

However, for some significant applications the use of junction isolation, or a combination of junction and lateral dielectric isolation, is not sufficient. For example, in some instances, the voltage employed in operation is often large enough to cause electrical breakdown between separate active regions. This electrical breakdown occurs through many paths such as by the penetration of charge carriers below one active region through the underlying substrate, across the substrate under the lateral isolation region, and into the second active region. When a typical junction isolation structure is employed, the voltages encountered in some applications, such as telephone line interface circuits, are sufficient to cause breakdown by charge carrier penetration through the isolating regions. To prevent such undesirable electrical interaction between two active regions, a combination of lateral and vertical dielectric isolation is employed. This dielectric isolation is provided by surrounding the single crystal silicon regions with an electrically insulating dielectric material. By this expedient, interaction between active regions even at high voltages is avoided. Additional advantages are also available by replacing junction isolation completely with dielectric isolation. Typical junction isolation introduces significant capacitance into the structure. It is possible in theory to increase the insulating capability of junction isolation to prevent breakdown in high-voltage devices. However, a high-voltage application requires a correspondingly high resistivity in the junction isolation region. Since the size of the depletion region increases with both voltage and resistivity, enhanced breakdown characteristics require an extremely large volume devoted to isolation. This large volume imposes a penalty both in the required volume per device and in increased parasitic capacitance. The substitution of dielectric isolation for junction isolation greatly reduces the area requirement, thereby reducing cost, and also reduces capacitance, allowing faster device operation.

A variety of processes have been employed to produce semiconductor components having dielectric isolation. These processes are designed not only to produce dielectric and lateral isolation but also to produce a relatively planar surface upon which further processing is performed to form devices in the active regions. (If the surface is not planar, subsequent device processing is considerably complicated.) Most of these processes involve the formation of a relatively thin dielectrically isolated active region. Generally, the thicker the active region the more difficult it has been to dielectrically isolate. One predominant method has been employed for thick active regions. (Thick active regions for the purpose of this disclosure are considered those with a thickness greater than 3 μm.) This dielectric isolation process to produce relatively thick active regions is described by K. E. Bean and W. R. Runyan, *Journal of the Electrochemical Society*, 124, 5C (1977). However, because of the strictures imposed by the requirements of dielectric isolation and planarity, this process involves a large number of complicated steps and introduces a high density ($10^4\,cm^{-2}$ to $10^5\,cm^{-2}$) of crystal defects and impurities. Additionally, the conditions employed in this technique often lead to significant bowing of the wafer being processed, e.g., bowing greater than 75 μm across a 3 inch-wafer and 200 μm across a 4 inch-wafer. This bowing, in turn, causes wafer breakage during subsequent processing. Thus, the manufacturing yields are low and costs are high for defect and impurity-sensitive devices fabricated by this process.

SUMMARY OF THE INVENTION

High voltage, dielectrically isolated devices are produced utilizing an expeditious melting technique. These devices, in particular, have a dielectric region of at least 1 μm thickness and have a single crystalline isolated region of at least 3 μm thickness. The devices are formed by first producing in a single crystalline wafer a cavity whose depth is greater than the thickness of the desired active region. A dielectric layer is then formed on the surfaces of the cavity by techniques such as thermal oxidation. To produce the desired inventive results, the dielectric layer should have a thickness of at least 1 μm. The dielectric layer is configured so that not all single crystal silicon regions, such as those of the underlying substrate are covered. (Uncovered single crystal regions are required to contact the subsequently deposited silicon.) Silicon is then deposited onto the dielectric material to a thickness of at least 3 μm. This silicon layer is deposited so that it extends continuously to a single crystal silicon region, e.g., a region of the wafer which is not coated with the dielectric material. The deposited silicon is then preferably covered with a capping layer, e.g, a SiO$_2$ layer, which is employed as a precaution against balling of the deposited silicon upon melting. The entire region of silicon formed on the dielectric material and continuing to a single crystal region is then brought to a molten state with energy such as radiant energy. Upon termination of the applied energy or upon reduction of the applied energy relative to the energy removed from the wafer, thermal gradients produced by the presence of the dielectric material cause a recrystallization which converts the silicon melt which encompasses the previously deposited silicon into high-quality, single crystal silicon. Thus, after removal of the silicon connecting the wafer to the material in the cavity, a thick, active region of dielectrically isolated single crystal silicon is produced by a relatively expeditious technique.

DETAILED DESCRIPTION

The inventive devices are produced on a single crystalline silicon wafer. Such wafers, since they provide a seed for recrystallization of the polycrystalline silicon, should be of high quality, i.e., should preferably have a crystallographic defect level less than 5000 cm$^{-2}$, most preferably less than 500 cm$^{-2}$. Additionally, the wafer should not have an excessive curvature. Generally, a curvature greater than 50 µm across 3 inches, although not precluded, produces unacceptable irregularities in subsequent processing procedures. The crystallographic orientation of the wafer is preferably that which includes the major surface of the wafer in the {100} plane. This orientation is preferred, although other orientations are not precluded, because well-controlled cavities are easily fabricated in {100} oriented silicon using known orientation dependent etches such as a heated mixture of KOH, isopropyl alcohol and water.

Figure 1:
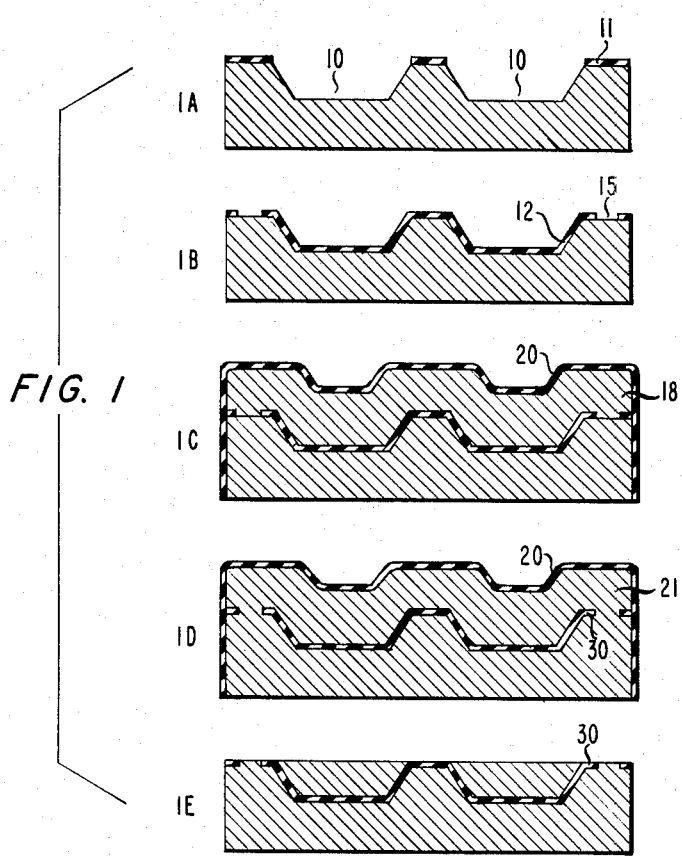
FIGS. 1 to 3 are illustrative of steps involved in the invention process.

Cavities, 10, in FIG. 1 are produced in the wafer. (Generally cavities are fabricated by etching, but other techniques are not precluded.) A cavity is formed for each dielectrically isolated active region which is desired. Typically, the dimension of the cavity is determined by the device to be fabricated. For the preferred orientation dependent etch where cavity dimensions are determined by the crystallographic planes of the wafer, the lateral dimension is generally confined to a length greater than approximately 2 times the desired depression depth and smaller than approximately 3 mm. If other etch processes, such as anisotropic plasma etching, are employed, smaller lateral dimensions are possible since this dimension would not be determined by the crystallographic planes of the wafer. However, an etch is precluded which produces a cavity wall contour which prevents the formation, in subsequent processing states, of a continuous silicon layer from the bottom of the cavity to an exposed region of the wafer. Dimensions greater than 3 mm are not precluded but generally are not required for typical device applications. (The particular shape of the active region, however, is not critical. The lateral dimensions given refer in the case of irregular shapes to the diameter of the smallest circle which can enclose the cavity.) The cavities are advantageously formed by conventional lithographic processes.

For example, the surface of the wafer is first oxidized. A lithographic resist, such as a novolac based resist, is deposited onto the oxide, 11, and patterned so that regions of the resist are removed to expose portions of the oxide where cavities are to be produced. The exposed portions of the oxide are then subjected to an etchant such as HF. The remaining resist is generally removed by conventional techniques, and the wafer with patterned oxide is then immersed in an orientation-dependent etch such as a heated (e.g., 80 degrees C) mixture of KOH, isopropyl alcohol and water. This etch, although too strong for organic resists, does not substantially attack the oxide which delineates the described etch pattern. The etching is continued until the cavity depth, as measured at the center of the cavity from the plane of the wafer surface to the bottom of the cavity, is larger than the thickness of the active region which is ultimately to be formed. Generally, for high voltage devices, i.e., devices greater than 30 V, active regions of greater than 3 µm thickness are desired. Although theoretically there is not limitation on cavity depth, etching to depths greater than 100 µm is unnecessarily time consuming and typically uneconomical. Since typical etch rates for etchants such as mixtures of KOH, isopropyl alcohol and water are in the range 0.5 to 2 µm/min, the cavity depth is easily controlled. (The exact rate depends on the temperature and concentration employed and is easily adjusted through the use of a control sample.) The desired etch depth is produced simply by terminating the contact between the etchant and the wafer after a sufficient etch time.

Once suitable cavities are formed, a dielectric material, 12, which at its final thickness exhibits a breakdown voltage greater than the voltage to be employed in device operation, is formed over the surfaces of the cavity, i.e., over the walls and floor of the cavity. Typically, the breakdown and leakage current requirement for devices operating in the range 30 to 1000 V should have dielectric layers having resistances greater than 10$^{12}$ ohm/cm$^2$ and breakdown voltages greater than 10$^6$ V/cm. Regions of the cavity walls near the cavity rim need not be dielectrically covered provided that the cavity walls are covered with dielectric material to a height (as measured from the bottom of the cavity toward the wafer surface in a direction normal to the wafer surface) which is sufficient to yield the desired active region thickness. Various dielectric materials are useful. For example, silicon dioxide and silicon nitride are employable. It is particularly desirable to employ silicon dioxide since it is conveniently formed. For example, it is possible in conjunction with conventional lithography to oxidize the cavity surfaces to produce the desired oxide regions. It should be noted that when this expedient is employed, the region of silicon dioxide generally swells. Thus, the depth of the cavity is reduced somewhat after thermal oxidation if the dielectric layer at the end of processing does not continue up the cavity walls and onto the wafer surface. Similarly when a dielectric material is deposited, cavity depth is lost and an analogous compensation should be made. In these circumstances the cavity should be made sufficiently deep to compensate and to allow for sufficient depth after dielectric formation to yield the desired active region thickness. Dielectric materials other than silicon dioxide are also produced by conventional techniques such as sputtering, plasma enhanced deposition, and low pressure chemical vapor deposition, followed by conventional lithography.

After the dielectric region is formed, silicon is deposited so that it entirely covers the surface of the dielectric material and continuously extends to a single crystal silicon region, e.g., a region, 15, of the substrate which is not covered by the dielectric material. This region of single crystal silicon is made accessible in a variety of ways. For example, the entire wafer surface is oxidized during formation of the dielectric material of the cavity surface. Openings, 15, are then made in the oxide. Alternatively, all the oxide is stripped from the wafer except that which is on the surfaces of the cavity. The thickness of the deposited silicon, 18, overlying the dielectric material depends on the desired thickness of the active region ultimately to be formed. A cap layer, 20, over the deposited silicon material, although not essential, is preferably employed as a precaution against balling of the melt. For example, a 2 $\mu$m thick layer of a dielectric material such as $SiO_2$ deposited by low-pressure chemical vapor deposition is employed.

Figure 2:
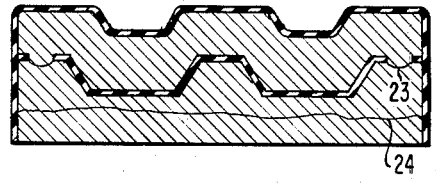

As previously discussed, once the silicon region is deposited, energy, preferably radiant energy, is employed to convert this region into high-quality, single crystal silicon material, 21. Depending on the conditions employed during the conversion process, it is possible that the thickness distribution of the deposited silicon will change. Since the entire region is brought to a molten state during conversion, producing an entirely liquid region, there is the possibility of material flow yielding thickness non-uniformities. (It is possible that some microcrystallites are present at the liquid surface. However these crystallites do not affect the process or the flow dynamics.) Typically, the degree of this flow depends on the depth to which melting is induced. As previously discussed, the portion of the deposited silicon region which is polycrystalline after formation, e.g., deposition, should be completely melted. (High temperature deposition often results in some epitaxial growth at single crystal exposed regions of the wafer and such epitaxial regions need not be completely melted) However, melting beyond this limit where significant portions of the single crystal substrate region are also melted is not precluded. The greater the depth to which the single crystal silicon region is melted, generally, the greater the shift in mass distribution in the portions of the wafer being processed which were originally the deposited silicon. A quantitative relationship between the initial thickness and the final thickness as a function of melt depth is not possible. However, a controlled sample is easily employed to determine the extent of mass change for a given melt depth, i.e., for a given thickness of wafer material melted. Exemplary of the changes in thickness which are encountered is the production of essentially no change when the silicon single crystal material is melted only slightly beyond the polycrystalline-single crystalline boundary, (23 in FIG. 2) as compared to a deposited layer thickness change of about 50 percent when the silicon wafer is melted to a depth of about 100 $\mu$m into the original wafer as shown at 24.

If a mass shift does occur and the newly formed single crystalline silicon is insufficiently thick, it is possible to increase thickness through conventional epitaxial growth techniques such as chemical vapor deposition. Similarly, if the region is too thick or if, as is commonly the case, the single crystal silicon region formed through melting extends beyond the boundaries of the dielectric material (as shown in FIG. 1D), then a polishing procedure is advantageously employed to thin the wafer so that this overlap is removed and advantageously so that a planar configuration, as shown in FIG. 1E, is obtained. This polishing is done by conventional techniques such as chem-mechanical polishing. In either case the polishing technique is utilized to thin the entire wafer and thus either to remove the portion of material extending beyond the dielectric regions or to remove an undesired thickness of the active region. It should be noted that polishing to the top region, 30, of an oxide which extends to the surface of the wafer affords a positive and well-regulated method for reproducibly controlling active region thickness and lateral dimension.

Figure 3:
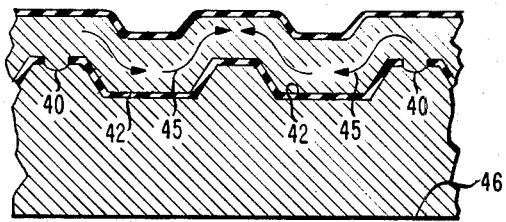

The melting technique itself is accomplished utilizing an energy source such as a radiant energy source. For example, an advantageous light source is an array of tungsten-halogen lamps. The incident energy for this radiant source is adjusted so that at least the entire thickness and extent of the deposited polycrystalline silicon material is melted. It is also necessary to bring to the molten state at least some portion of the single crystal region as, for example, shown at 23 in FIG. 2, where it contacts the initially deposited and subsequently melted material. (The single crystal region includes any deposited material which was epitaxially formed into single crystal material.) The degree of this melting is not critical. Typically, appropriate melting of deposited silicon regions 3 $\mu$m to 100 $\mu$m thick is accomplished using incident intensity levels of approximately 65 to 85 watts/cm$^2$. The particular spectrum of the radiant energy is not critical. Generally, wavelengths in the range 0.2 to 10 $\mu$m are advantageously utilized. (Although radiant energy is preferred, other energy sources, such as impacting electrons, are also useful.) It is desirable that the incident energy is primarily absorbed in proximity to the impacted surface to produce temperatures in the vicinity of 1410 degrees C. and that the other major surface of the wafer is maintained at a temperature below the melting temperature. After the appropriate degree of melting is accomplished, heating is terminated or reduced so that the energy flow to the impacted surface is correspondingly reduced and so that there is a net loss of energy from the wafer to its surroundings. Surprisingly, upon termination, the single crystal structure of the silicon wafer is propagated entirely across the formerly deposited silicon material (as shown by the arrows in FIG. 3) to produce a single crystal active region. This is particularly surprising since propagation starts from point, 40, in FIG. 3 and extends completely across region, 45. It should be noted that cooling predominately occurs from the region of the wafer, 46, which is opposite the surface exposed to the radiation. Point, 40, where crystallization is initiated, is further from this cooling surface than the points, 42, defining the interface between the silicon melt and the dielectric material. It is therefore reasonable to believe that freezing of the melt at points, 42, (which are closer to a cooling source) would occur and cause recrystallization before the single crystal silicon from point, 40, propagates entirely across the molten material. Nevertheless, it has been found that if the dielectric material is at least 1 $\mu$m in thickness, this undesirable occurrence is avoided.

After formation of the dielectrically isolated region, devices are formed in the active region by conventional techniques. The following examples are illustrative of the subject invention.

EXAMPLE 1

A polished silicon wafer 3 inches in diameter having its major surface in the {100} plane was purchased from a commercial supplier. A cleaning solution was prepared by mixing 12.24 kg of concentrated sulfuric acid with 1000 ml of 30 percent hydrogen peroxide. The solution was heated to 100 degrees C. and the wafer was immersed in it for approximately 10 minutes. The wafer was transferred to a deionized water bath that was heated to 70 degrees C. The water in the bath was exchanged three times and then the wafer was dried by spinning. The wafer was introduced into a furnace which had been heated to 1050 degrees C. An oxidizing atmosphere was produced in the furnace by bubbling oxygen through a water bubbler heated to 98 degrees C. and introducing into the furnace the oxygen which was thus saturated with water vapor. The treatment of the water with oxygen was continued for 80 minutes to produce a 0.5 micron thick silicon oxide layer.

A 1 micron thick layer of AZ 111 positive resist (a proprietary product of Shipley Company) was spun onto the silicon oxide layer. The resist was exposed with a mercury lamp through a mask which contacted the resist surface. The mask consisted of a series of transparent rectangles of varying sizes which were separated by approximately 100 micron wide spaces. The resist was developed in a commercial resist developer. The exposed oxide regions were then etched away by immersing the wafer in a buffered aqueous solution of HF for 30 minutes. The resist was then removed by utilizing a commercial resist stripper, and the wafer was again cleaned utilizing the previously described hydrogen peroxide/sulfuric acid treatment with the associated rinse and drying steps.

A mixture including 1740 ml water, 750 g of KOH, and 510 g of isopropyl alcohol was prepared by first dissolving the KOH in the water and subsequently adding the isopropyl alcohol to the aqueous KOH solution. The mixture was heated to approximately 80 degrees C. (The isopropyl alcohol was not totally soluble in the aqueous solution even at 80 degrees C., and therefore a portion of the added alcohol formed a separate phase which floated on the aqueous portion). The wafers were prepared for treatment in this mixture by first immersing them for approximately 30 seconds in a mixture of 1 part HF and 15 parts water. The wafers were then rinsed in deionized water for approximately 2 minutes and immediately immersed in the water/KOH/alcohol mixture. The wafer in the mixture underwent an etching which proceeded at a rate of 1.5 microns per minute in a direction normal to the major surface of the wafer. Since an etch depth of 60 microns was desired, the wafer was maintained in the mixture for approximately 40 minutes and then removed. The wafer was again rinsed for approximately 2 minutes in deionized water and spun dry in an atmosphere of heated dry nitrogen. The etch followed crystallographic planes and produced a cavity having side walls oriented in the {111} plane and having a floor which was oriented in the {100} plane.

The remaining oxide mask was removed by immersing the wafer in a buffered aqueous solution of HF for 10 minutes. A 3.5 micron thick layer of silicon dioxide was grown on the treated surface of the wafer by thermal oxidation. This thermal oxidation was achieved by introducing the wafer into a furnace heated to 1150 degrees C. The atmosphere of the furnace was produced by bubbling oxygen through a water bubbler heated to 98 degrees C. and introducing into the furnace the oxygen which was thus saturated with water vapor. The treatment of the wafer with oxygen was continued for 22 hours to produce a 3.5 micron thick layer of $SiO_2$.

An approximately 7.0 μm thick layer of SC180 negative resist (a proprietary product of the Waycoat Co.) was spun onto the wafer covering the oxide layer and baked at 80 degrees C. The resist was exposed with a mercury lamp through the same mask which was employed for delineating the pattern in the cavity etch procedure. The resist after exposure was developed in a commercial resist developer. This exposure and development procedure produced openings in the resist in the regions of the wafer where cavities were absent. The resist was baked at 150 degrees C. for 10 minutes. The oxide uncovered by development of the resist was then removed utilizing a hot-bath etch. This etch involved a treatment for a period of 10 minutes in a mixture of 7 parts $NH_4F$ and 1 part HF heated to 42 degrees C. The resist was then removed by utilizing commercial resist stripper and the wafer was again cleaned utilizing the previously described hydrogen peroxide/sulfuric acid treatment with the associated rinse and drying steps.

The wafer was transferred to the sample holder of an AMV-1200 CVD reactor sold by Applied Materials, Inc. The wafer was positioned so that the patterned silicon oxide surface was exposed. The system was purged with dry nitrogen and then with dry hydrogen. The wafer was heated to 1050 degrees C. in dry hydrogen. The hydrogen flow was adjusted to give a flow rate of 95 liters per minute. A flow of silane at a rate of 150 sccm per minute was established, combined with the hydrogen flow, and continued for approximately 5 minutes producing approximately 2 microns of silicon growth. The silane flow was terminated, a flow of 37 g per minute of trichlorosilane was then established, and the trichlorosilane flow was combined with the 95 liters per minute flow of hydrogen. The temperature was maintained at 1050 degrees C. The trichlorosilane flow was continued for approximately 25 minutes to produce a total deposited silicon thickness of 60 microns. The trichlorosilane flow was then terminated. The deposition chamber was purged with dry hydrogen for 1 minute, the heating was terminated, and the wafer was allowed to cool in the dry hydrogen atmosphere.

The surface of the deposited polycrystalline silicon material was cleaned, rinsed and dried by the previously described procedure. A silicon dioxide capping layer was deposited by the low-pressure chemical vapor deposition process described in R. S. Rosler, *Solid State Technology*, 63–70, April 1977. In this procedure the substrate was heated to approximately 430 degrees C. The total pressure of silane and oxygen introduced into the apparatus was approximately 0.5 Torr. The flow rates of silane, oxygen and nitrogen were, respectively, 60 sccm, 520 sccm and 1500 sccm. The deposition of this silicon dioxide capping layer continued for approximately 182 minutes to produce a layer thickness of approximately 2 micron.

The wafer was then transferred to the sample holder of a radiant heat furnace. This furnace consisted of two chambers separated from each other and sealed off by quartz plates. Each wafer was positioned on three quartz pins in the lower chamber, about 0.5 inches above a water-cooled blackened aluminum oven floor. The upper chamber contained a bank of tungsten-halogen lamps suspended below a gold plated reflector. Both chambers had lateral dimensions of 10×12.5 inches. To avoid lamp overheating and early failure, air was forced through the fully enclosed upper chamber, which is essentially a wind tunnel with a quartz lower wall. Three phase-angle fired power supplies controlled by a microprocessor provided in excess of 100 KW to the lamps, which is sufficient to melt silicon. After the wafer was inserted with the capping layer facing the lamps, the furnace was closed, the air cooling of the lamps begun, and the water cooling of the oven floor initiated. An oxygen flow was introduced into the sample chamber of the furnace to provide an atmosphere of oxygen around the wafer. The power to the lamps was linearly increased over a period of 10 seconds from 0 to 112 kW. The use of 112 kW of electrical power provided approximately 78 to 85 W/cm$^2$ of radiant energy to the entire capping surface of the sample. The 112 kW power level was continued for 10 seconds. The lamp current was then linearly decreased to zero over a time period of 180 seconds. By this procedure the polycrystalline material overlying the silicon dioxide dielectric was entirely converted to single crystal silicon. The silicon dioxide capping layer was removed by immersing the wafer in a buffered HF aqueous solution for approximately 30 minutes.

After the melting procedure, the single crystal silicon material overlying the oxide layer in the cavities was approximately 24 microns thick. The thinning of this silicon in the cavity region was due to redistribution of the deposited silicon during the melting process. An epitaxial growth was performed to bring the thickness of the single crystal silicon region overlying the oxide layer to a thickness of 75 microns. This growth was accomplished in the same reactor as previously described using a 95 l/min flow rate of hydrogen and 10 g/min flow of silicon tetrachloride at 1150 degrees C. This flow was continued for approximately 35 minutes to yield the desired thickness.

The wafer was then polished to remove excess single crystal silicon and to yield the structure shown at FIG. 1E. The polishing was performed employing a conventional chem-mechanical polish utilizing an aqueous KOH solution (approximately pH10) chemical etchant and using a silica abrasive having an average grain size of 0.1 μm.

EXAMPLE 2

The procedure of Example 1 was followed up to and including the step of growing a 3.5 micron thick silicon dioxide layer. Then, an approximately 2.0 μm thick layer of SC180 resist was spun onto the wafer and baked at 80 degrees C. The resist was exposed through a mask which shaded a region measuring 160×1270 μm between cavities, spaced at two cavity intervals. This shaded region was oriented so that its long dimension was perpendicular to an imaginary line extending through the center of all the cavities of a single row. After exposure, the resist was developed using a conventional developing solution and baked at a temperature of 150 degrees C. for 10 minutes. A second layer of the same resist having a thickness of 2.0 μm was then spun upon the first layer of resist and baked at 80 degrees C. The same pattern was again exposed, developed, and baked. The oxide uncovered by development of the resist was removed utilizing the hot-bath etch described in Example 1. The photoresist was then removed utilizing a conventional stripper and the exposed wafer was cleaned utilizing the previously described cleaning procedure. The remaining procedure of Example 1 beginning with the deposition of silicon into the established cavities was followed except 150 μm of silicon was deposited and the cavities were etched to a depth of 50 μm. Additionally, unlike Example 1, an epitaxial growth following the melting of the deposited silicon layer was not needed since substantial redistribution did not occur.

What is claimed is:

1. A process for producing dielectrically isolated electronic devices in a semiconductor body comprising single crystal silicon, comprising the steps of depositing a layer of silicon on a dielectric material and converting said deposited silicon layer into a single crystal silicon region, CHARACTERIZED IN THAT said dielectric material is at least 1 μm thick and is formed on the surfaces of a cavity in said semiconductor body, said deposited silicon extends continuously to a single crystal silicon nucleation region and said conversion to said single crystal silicon region is effected by first melting all of said deposited silicon layer to form a molten region extending to said single crystal nucleation region and then inducing recrystallization.

2. The process of claim 1 wherein said dielectric material comprises silicon dioxide.

3. The process of claim 2 wherein said silicon dioxide is formed by thermal oxidation.

4. The process of claim 1 wherein said melting is performed with radiant energy.

5. The process of claim 1 wherein said cavity is formed utilizing a crystallographic etchant.

6. The process of claim 1 wherein said single crystal nucleation region is a portion of said semiconductor body.

7. The process of claim 1 wherein said melting is performed in the presence of a capping layer on said deposited silicon layer.

8. The process of claim 7 wherein said capping layer comprises silicon dioxide.

9. The process of claim 1 wherein said converted region is polished.

* * * * *